United States Patent [19]
Oprescu

[11] Patent Number: 6,140,950
[45] Date of Patent: Oct. 31, 2000

[54] DELTA-SIGMA MODULATOR WITH IMPROVED FULL-SCALE ACCURACY

[75] Inventor: Florin A. Oprescu, Sunnyvale, Calif.

[73] Assignee: Linear Technology Corporation, Milpitas, Calif.

[21] Appl. No.: 09/135,224

[22] Filed: Aug. 17, 1998

[51] Int. Cl.[7] ................................................. H03M 3/00
[52] U.S. Cl. ................. 341/143; 341/125; 341/155; 341/139
[58] Field of Search .................................. 341/143, 125, 341/155, 139

[56] References Cited

U.S. PATENT DOCUMENTS

| | | | |
|---|---|---|---|
| 3,585,634 | 6/1971 | Sharples | 340/347 |
| 4,920,544 | 4/1990 | Endo et al. | 375/26 |
| 5,008,674 | 4/1991 | Da Franca et al. | 341/150 |
| 5,134,401 | 7/1992 | McCartney et al. | 341/143 |
| 5,659,314 | 8/1997 | Tokura et al. | 341/143 |
| 5,703,589 | 12/1997 | Kalthoff et al. | 341/172 |
| 5,745,060 | 4/1998 | McCartney | 341/120 |
| 5,790,064 | 8/1998 | Fujimori | 341/172 |
| 5,835,038 | 11/1998 | Nakao et al. | 341/131 |
| 5,905,453 | 5/1999 | Kase | 341/143 |

OTHER PUBLICATIONS

Steven R. Norsworthy et al., "Decimation and Interpolation for ΔΣ Conversion," Delta–Sigma Data Converters, Steven R. Norsworthy et al. eds., Ch. 13, pp. 406–444, IEEE Press 1997.

James C. Candy et al., "Oversampling Methods of A/D and D/A Conversion," Oversampling Delta–Sigma Converters, Steven R. Norsworthy et al. eds., pp. 1–25, IEEE Press 1992.

Max W. Hauser, "Principles of Ovrsampling A/D Conversion," J. Audio Eng. Soc., vol. 39, No. 1/2, pp. 3–26, Jan./Feb. 1991.

James C. Candy et al., "Using Triangularly Weighted Interpolation to Get 13–Bit PCM from a Sigma–Delta Modulator," IEEE Trans. Commun., vol. COM–24, pp. 1268–1275, Nov. 1976.

Max W. Hauser et al., "Circuit and Technology Considerations for MOS Delta–Sigma A/D Converters," 1986 IEEE Int'l Symp. Circuits & Sys., pp. 1310–1315, May 1986.

*Primary Examiner*—Brian Young
*Assistant Examiner*—Jason L W Kost
*Attorney, Agent, or Firm*—Fish & Neave; Joel Weiss

[57] ABSTRACT

The invention provides methods and apparatus for improving the full-scale accuracy of an oversampling analog-to-digital converter. In particular, an improved switched-capacitor subtractor/integrator circuit is described that effectively provides a desired capacitor ratio by using N+M distinct unit capacitors that each sample an input signal a first predetermined number of times and sample one or more reference signals a second predetermined number of times, where the ratio of the first predetermined number to the second predetermined number is the desired capacitor ratio N/M.

20 Claims, 7 Drawing Sheets

DELTA-SIGMA MODULATOR WITH IMPROVED FULL-SCALE ACCURACY

FIELD OF THE INVENTION

The present invention relates to oversampling analog-to-digital converters. More particularly, the present invention relates to methods and apparatus for improving the full-scale accuracy of a delta-sigma modulator in an oversampling analog-to-digital converter.

BACKGROUND OF THE INVENTION

Converting a continuous-time analog signal to a discrete-time digital representation typically requires anti-alias filtering, sampling and quantization. An anti-aliasing filter ensures that analog input signal is properly band-limited prior to sampling. A sampler captures samples of the filtered input signal at discrete time intervals, typically $T=1/F_s$, where $F_s$ is the sampling frequency. The sampling frequency $F_s$ typically is selected as twice the bandwidth of the filtered analog input signal. Finally, a quantizer converts the samples to a discrete set of values. Conventional analog-to-digital (A/D) converters typically perform sampling and quantization, whereas separate discrete components or integrated circuits perform anti-aliasing.

Oversampling A/D converters, in contrast, sample an analog input signal at a rate $DF_s$ that exceeds twice the bandwidth of the analog input signal. An oversampling converter typically includes an anti-alias filter, a sampler and modulator (quantizer) that operate at the elevated rate $DF_s$, and a digital filter. The digital filter, typically called a decimator, provides low-pass filtering to suppress signals above $F_s/2$, and sample-rate reduction to lower the sample rate to the desired rate $F_s$.

As a result of the higher input sampling rate, oversampling converters have less stringent anti-alias filter requirements than traditional converters. In addition, oversampling converters permit lower quantization noise power, and hence improved signal-to-noise ratio compared to traditional converters.

A/D converters typically operate over a specified maximum and minimum input signal range. The maximum input signal typically is referred to as the converter's full-scale input value. Under ideal conditions, if a full-scale input is applied to the converter, the converter provides a full-scale output. In reality, however, the converter's actual output differs from the ideal result, and the difference between the actual output and the ideal output is the full-scale error. A full-scale accurate converter has zero full-scale error.

A full-scale accurate oversampling converter has significant practical importance in such fields as data acquisition, test and measurement instrumentation, industrial control, etc., because the converter provides a DC-accurate conversion result, exceptional unwanted signal rejection capabilities and simple anti-alias requirements.

Figure 1:
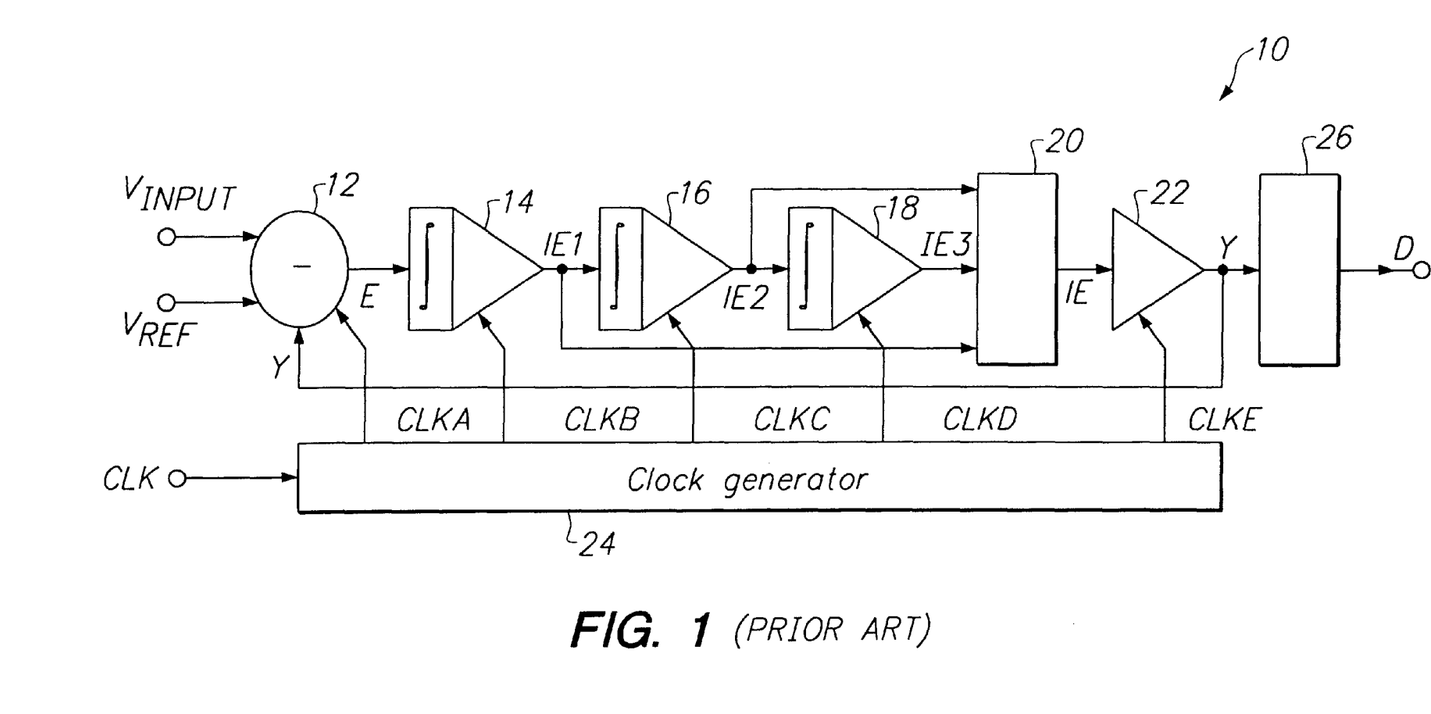
FIG. 1 is a schematic block diagram of a previously known delta-sigma analog-to-digital data converter.

Referring to FIG. 1, a common implementation of a delta-sigma oversampling converter is described. Converter 10 includes subtractor circuit 12, integrators 14, and 18, output adder 20, comparator 22, clock generator 24 and digital filter 26.

Based on the state of clock signal CLKA and digital signal Y, subtractor circuit 12 subtracts analog reference signal $V_{REF}$ from analog input signal $V_{INPUT}$. Integrator 14 integrates the resultant error signal E during each cycle of clock signal CLKB and generates output signal IE1. Integrator 16 integrates IE1 during each cycle of clock signal CLKC and generates output signal IE2. Integrator 18 integrates IE2 during each cycle of clock signal CLKD and generates output signal IE3. Output adder 20 produces the algebraic sum of output signals IE1, IE2 and IE3 to create the third-order integrated and feed-forward compensated error signal IE.

Comparator 22 compares error signal IE with an internal reference (not shown) and generates digital output signal Y for every cycle of clock signal CLKE. Digital output Y only has two possible states, and thus can be represented in binary form by a single bit.

Clock generator 24 generates clock signals CLKA, CLKB, CLKC, CLKD and CLKE from external control signal CLK, with appropriate relative phase relations for specific implementations of the modulator blocks.

Digital stream Y contains a digital representation of the ratio R between input signal $V_{INPUT}$ and reference signal $V_{REF}$. Output Y may be extracted and further transformed through digital processing in decimation filter 26. Output D of digital filter 26 is the conversion result.

The full scale output of converter 10 equals the converter's output $D_{FSI}$ when full-scale signal $V_{FSI}$ is applied at the converter's input $V_{INPUT}$. Under ideal conditions, the ratio of the full-scale input signal $V_{FSI}$ to $V_{REF}$ is defined as:

$$k = \frac{V_{FSI}}{V_{REF}} \tag{1}$$

Generally, k is a non-zero proportionality constant, whose value depends upon the convertor's operating range.

As a result of component tolerances and operating condition variations, however, the converter's actual output does not equal $D_{FSI}$ when $V_{FSI}$ is applied to the converter's input. Instead, the actual output of the converter equals $D_{FSI}$ when input signal $V_{FSA}$ is applied to the converter's input. The ratio between $V_{FSA}$ and reference signal $V_{REF}$ is given by:

$$R_{FS} = \frac{V_{FSA}}{V_{REF}} \tag{2}$$

The relative full-scale error is defined as:

$$E_{FS} = 1 - \frac{R_{FS}}{k} \tag{3}$$

Under ideal conditions, $R_{FS}=k$, and $E_{FS}=0$.

Prior art oversampling A/D converters have used digital calibration to compensate for full-scale error. The AD7714 oversampling A/D converter, for example, manufactured by Analog Devices Inc., Norwood, Mass., implements such an approach. In particular, the AD7714 performs a dedicated full-scale self-calibration conversion during which an internally-generated signal $V_{FSI}$ is applied to the converter input. Ideally, the converter output is $D_{DFSI}$. The actual output $D_{FSA}$ is compared to the desired output $D_{FSI}$, and a digital computer determines the error $E_{FS}$ and an appropriate correction factor $K_c$. Subsequently, the digital computer applies $K_c$ to all converter results D.

The approach used in the AD7714 requires complex circuits that increase converter's size, power consumption and internally-generated noise. Further, a change in environmental conditions invalidates the previously calculated correction coefficient $K_c$, and requires a new full-scale calibration cycle. Because digital calibration cycles decrease converter throughput, frequent digital calibration results in a reduced equivalent conversion rate.

The full-scale accuracy of converter 10 primarily depends on the accuracy of input subtractor circuit 12. In typical circuit implementations, subtractor circuit 12 and integrator 14 are combined in a single switched-capacitor circuit, and the accuracy of the subtraction function depends on a ratio of two input sampling capacitors. Prior art circuits have attempted to control this critical ratio using well-known integrated circuit layout techniques. Although these layout techniques eliminate the disadvantages related to digital calibration, circuit layout approaches have not achieved the desired level of accuracy.

It therefore would be desirable to provide a delta-sigma analog-to-digital converter that has reduced full-scale error without requiring digital calibration.

It also would be desirable to provide a delta-sigma analog-to-digital converter that has reduced full-scale error without depending on critical capacitor ratios.

SUMMARY OF THE INVENTION

Accordingly, it is an object of this invention to provide a delta-sigma analog-to-digital converter that has reduced full-scale error without requiring digital calibration.

It also is an object of this invention to provide a delta-sigma analog-to-digital converter that has reduced full-scale error without depending on critical capacitor ratios.

In accordance with these and other objects of the present invention, a subtractor/integrator circuit is provided that effectively has input sampling capacitors $C_{IN}$ and $C_{REF}$ having a ratio that may be expressed as a rational number N/M, where N and M are relative prime integers. The circuit provides this ratio using N+M distinct unit capacitors $C_{U1}$, $C_{U2}$, ... $C_{U(M+N)}$ under the control of a state machine. The state machine causes each distinct unit capacitor $C_{U1}$, $C_{U2}$, ... $C_{U(M+N)}$ to sample an input signal a first predetermined number of times to effectively construct an equivalent input capacitor $C_{IN}$, and causes each distinct unit capacitor $C_{U1}$, $C_{U2}$, ... $C_{U(M+N)}$ to sample one or more reference signals a second predetermined number of times to effectively construct an equivalent reference capacitor $C_{REF}$. The ratio of the first predetermined number and the second predetermined number equals the desired ratio N/M. As a result, the ratio between the effective capacitances $C_{IN}$ and $C_{REF}$ depends only on the state machine states, which can be controlled with practically unlimited accuracy.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION OF THE INVENTION

To provide background for the present invention, this written description first sets forth a previously known subtractor/integrator circuit and describes the circuit components that affect full-scale error. Then, the modification of such previously known subtractor/integrator circuits is described and alternative embodiments are disclosed.

A. Prior Art Subtractor/Integrator Circuit

Figure 2A:
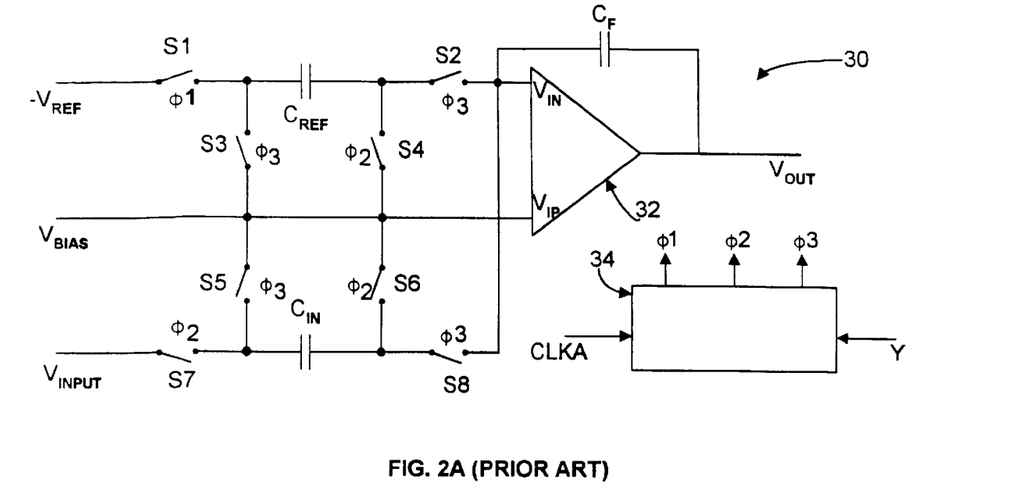
FIG. 2A is a schematic block diagram of a previously known subtractor/integrator block and FIG. 2B is a timing diagram for the circuit of FIG. 2A.
Figure 2B:
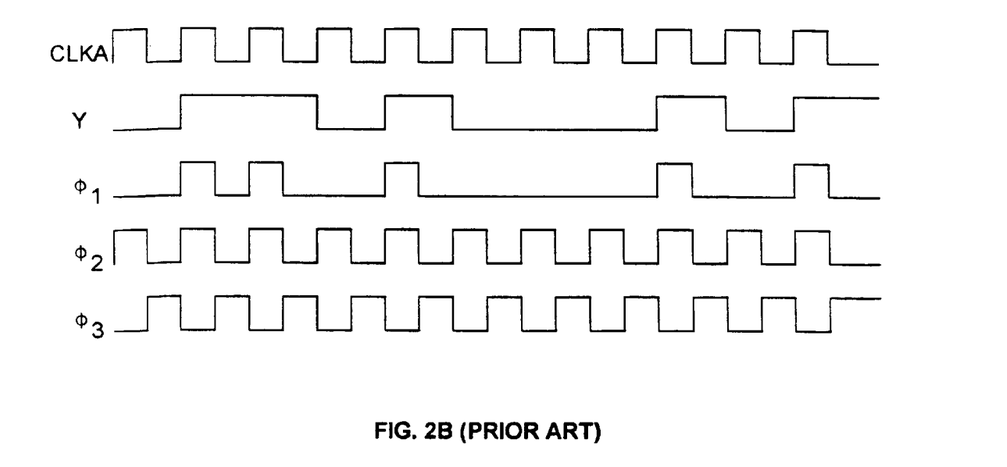

Referring to FIG. 2, a previously known circuit that combines the function of subtractor 12 and integrator 14 of FIG. 1 is described. Circuit 30 includes amplifier 32 having inverting input $V_{IN}$, non-inverting input $V_{IP}$ and output $V_{OUT}$. Integrating capacitor $C_F$ is coupled between $V_{IN}$ and $V_{OUT}$. Capacitor $C_{REF}$ is coupled between reference node $-V_{REF}$ and $V_{IN}$ through switches S1 and S2, and is coupled to bias node $V_{BIAS}$ through switches S3 and S4. Capacitor $C_{IN}$ is coupled between input signal node $V_{INPUT}$ and $V_{IN}$ through switches S7 and S8, and is coupled to $V_{BIAS}$ through switches S5 and S6. Switch S1 is controlled by clock signal $\phi_1$. Switches S4, S6 and S7 are controlled by clock signal $\phi_2$, and switches S2, S3, S5 and S8 are controlled by clock signal $\phi_3$. State machine 34 receives as inputs CLKA and Y (of FIG. 1), and generates clock signals $\phi_1$, $\phi_2$ and $\phi_3$. FIG. 2B shows the timing relationship between CLKA, Y, $\phi_1$, $\phi_2$ and $\phi_3$. Y only may change on the rising edge of CLKA.

Circuit 30 receives input signal $V_{INPUT}$ and signal $-V_{REF}$ and produces the intermediary signal IE1 (FIG. 1) at $V_{OUT}$. Internally-generated bias signal $V_{BIAS}$ (which may or may not be circuit ground) is used as a reference for charging and discharging charge transfer capacitors $C_{IN}$ and $C_{REF}$ and integrating capacitor $C_F$. When Y and CLKA are both HIGH, capacitor $C_{REF}$ samples $-V_{REF}$ and capacitor $C_{IN}$ samples $V_{INPUT}$. When Y is LOW and CLKA is HIGH, capacitor $C_{REF}$ remains discharged (i.e., effectively samples 0 volts) and capacitor $C_{IN}$ samples $V_{INPUT}$. In both cases, when CLKA changes from HIGH to LOW, the charges stored on capacitors $C_{REF}$ and $C_{IN}$ are transferred to integrating capacitor $C_F$.

For circuit 30, the full-scale accuracy primarily depends on the ratio accuracy of $C_{REF}$ and $C_{IN}$. In particular, when clock signals $\phi_4$ and $\phi_2$ are both HIGH, an electrical charge $Q_{REF}$ proportional to reference signal $-V_{REF}(Q_{REF}=-C_{REF}*V_{REF})$ is stored on capacitor $C_{REF}$, and an electrical charge $Q_{IN}$ proportional to input signal $-V_{INPUT}(Q_{IN}=C_{IN}*V_{INPUT})$ is stored on capacitor $C_{IN}$. On the next pulse of $\phi_3$ (i.e., when $\phi_2$ goes LOW and $\phi_3$ goes HIGH), electrical charges $Q_{IN}$ and $Q_{REF}$ are transferred to integrating capacitor $C_F$. Amplifier 32 facilitates the charge transfer. Various methods for constructing amplifier 32 are well-known.

A complete cycle of state machine 34 is defined as one complete cycle of CLKA, which includes one complete cycle of clocks $\phi_2$ and $\phi_3$. At the end of one complete cycle of CLKA when Y is HIGH, the total charge $Q_{TOT}$(HIGH) transferred to integrating capacitor $C_F$ equals the sum of the charges stored on $C_{REF}$ and $C_{IN}$ during the cycle:

$$Q_{TOT}(\text{HIGH}) = C_{IN}*V_{INPUT} - C_{REF}*V_{REF} \qquad (4)$$

At the end of one complete cycle of CLKA when Y is LOW, the total charge $Q_{TOT}$(LOW) transferred to integrating capacitor $C_F$ equals the sum of the charges stored on $C_{REF}$ (which has zero charge) and $C_{IN}$ during the cycle:

$$Q_{TOT}(LOW) = C_{IN} * V_{INPUT} \quad (5)$$

The ratio of $Q_{TOT}(LOW)$ to $Q_{TOT}(HIGH)$ depends on the ratio of $C_{IN}$ to $C_{REF}$ and on the relative voltage ratio of $V_{INPUT}$ to reference signal $V_{REF}$. Accordingly, the full-scale accuracy of the modulator depends on the a ratio of $C_{IN}$ to $C_{REF}$.

In integrated circuit technology, capacitor value is proportional to the area of the capacitor top and bottom plates, and inversely proportional to the thickness of dielectric between the two plates. Assuming that the dielectric thickness for capacitors within an integrated circuit is uniform, the ratio of two capacitors depends solely on their area ratios. As a result, prior art integrated circuit techniques typically seek to improve the accuracy of the ratio of $C_{IN}$ to $C_{REF}$ by controlling the accuracy of the ratio of the areas of the two capacitors.

Figure 3A:
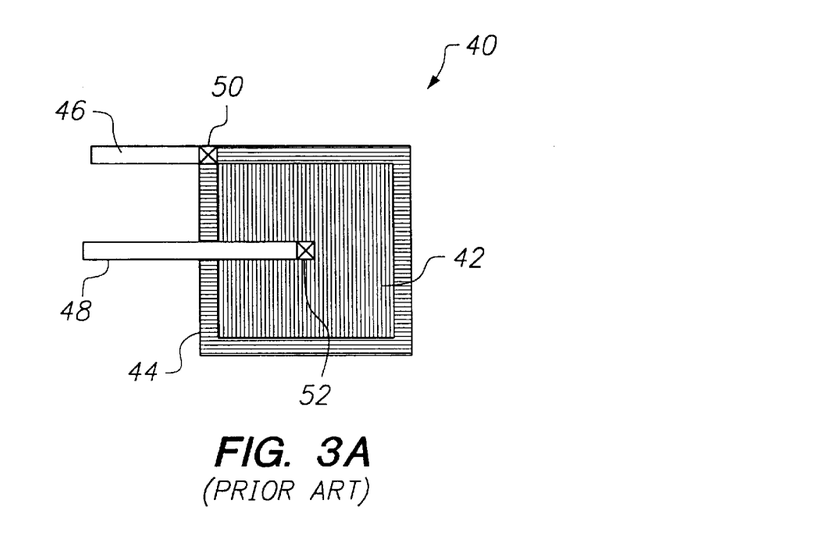
FIG. 3A is an illustrative diagram of a prior art integrated circuit capacitor.
Figure 3B:
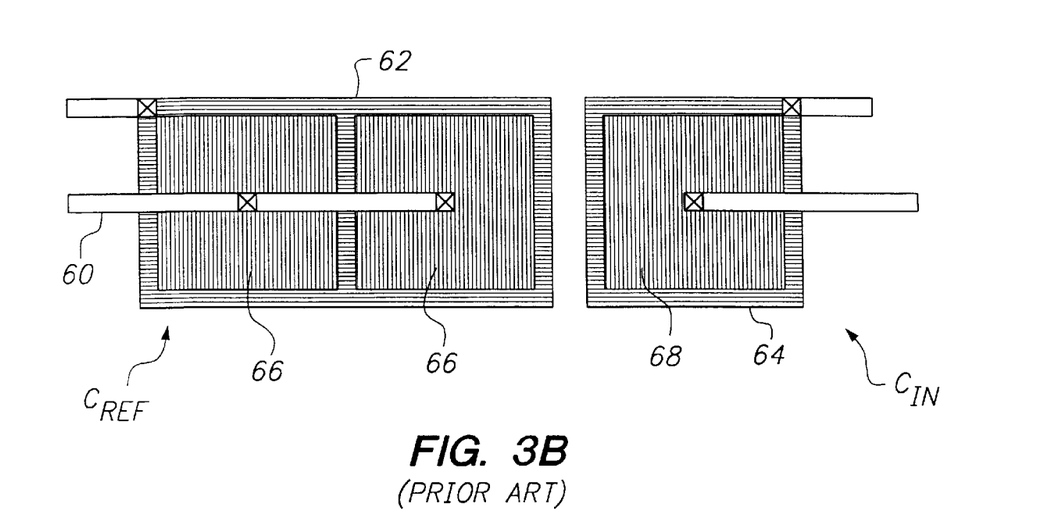
FIG. 3B is a diagram of two capacitors formed from the integrated circuit capacitor of FIG. 3A

To improve area ratio accuracy, integrated circuit capacitors typically are constructed using arrays of identical "unit" capacitors that are connected to provide specific capacitor values. FIG. 3 shows an example of a typical prior art technique for constructing capacitors $C_{IN}$ and $C_{REF}$, whose ratio is 1:2. FIG. 3A shows unit capacitor 40 having top plate 42, bottom plate 44, conductor 46 connected to bottom plate 44 by contact 50, and conductor 48 connected to top plate 42 by contact 52.

FIG. 3B shows capacitors $C_{IN}$ and $C_{REF}$ formed from unit capacitor 40. In particular, $C_{REF}$ is formed from two unit capacitors, and includes top plates 66 joined by conductor 60, and bottom plate 62. $C_{IN}$ is constructed from a single unit capacitor, and consists of top plate 68 and bottom plate 64. Although such prior art layout techniques improve ratio accuracies, the techniques by themselves do not permit very low full-scale error in oversampling delta-sigma analog-to-digital converters.

B. The Invented Subtractor/Integrator

In accordance with principles of the present invention, a subtractor/integrator circuit is provided for oversampling delta-sigma A/D converters that effectively provides input sampling capacitors $C_{IN}$ and $C_{REF}$ having a ratio that may be expressed as a rational number N/M, where N and M are relative prime integers. The circuit provides this ratio using N+M distinct unit capacitors $C_{U1}, C_{U2}, \ldots C_{U(M+N)}$, under the control of a state machine.

In particular, the state machine controls how each distinct unit capacitor $C_{U1}, C_{U2}, \ldots C_{U(M+N)}$ is used to sample the signals $V_{INPUT}$ and $-V_{REF}$. During one complete cycle of the new state machine (i.e., one cycle of CLKA in FIG. 1), each unit capacitor $C_{U1}, C_{U2}, \ldots C_{U(M+N)}$ samples $V_{INPUT}$ a first predetermined number of times to effectively construct an equivalent input capacitor $C_{IN}$. Similarly, during one complete cycle of the new state machine, depending on whether Y is LOW or HIGH, each unit capacitor $C_{U1}, C_{U2}, \ldots C_{U(M+N)}$ samples $-V_{REF}$ (or $+V_{REF}$) a second predetermined number of times to effectively construct an equivalent reference capacitor $C_{REF}$.

The first predetermined number of times is equal to C(M+N−1, N−1), where C(i,j) is the well-known binomial coefficient:

$$C(i, j) = \frac{i!}{(i-j)! j!} \quad (6)$$

The second predetermined number of times is equal to C(M+N1, M−1).

One state machine cycle corresponds to one cycle of CLKA (FIG. 1). However, the state machine operates C(M+N,N) times the frequency of CLKA. The result of the state machine cycle is an equivalent input capacitor $C_{IN} = N*C(M+N,N)*C_{UNIT}$ and an equivalent reference capacitor $C_{REF} = M*C(M+N, N)*C_{UNIT}$, where $C_{UNIT}$ is the unit capacitor value. Each unit capacitor $C_{U1}, C_{U2}, \ldots C_{U(M+N)}$ is used to construct the equivalent $C_{IN}$ capacitor exactly C(M+N−1, N−1) times and to construct the equivalent $C_{REF}$ capacitor exactly C(M+N−1, M−1) times. Hence, the ratio of the equivalent capacitors $C_{IN}$ to $C_{REF}$ becomes exactly N/M, independent of the actual value of the M+N distinct unit capacitors $C_{U1}, C_{U2}, \ldots C_{U(M+N)}$.

Figure 4:
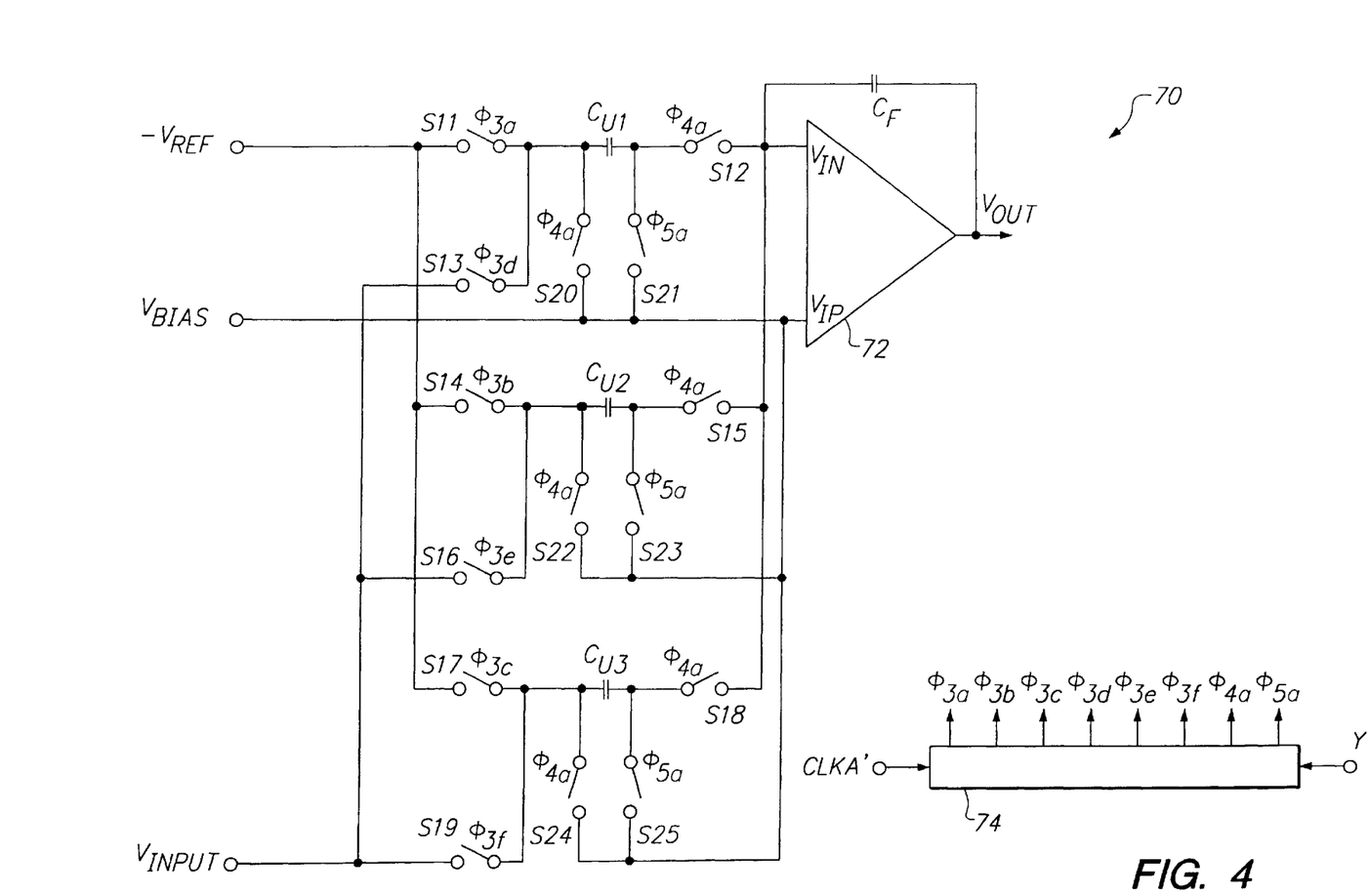
FIG. 4 is schematic diagram of an illustrative embodiment of a subtractor/integrator block and state machine of the present invention.

Referring to FIG. 4, an exemplary embodiment of a subtractor/integrator of the present invention is described in which N=1 and M=2. Subtractor/integrator circuit 70 includes amplifier 72 having inverting input $V_{IN}$, non-inverting input $V_{IP}$ and output $V_{OUT}$. Integrating capacitor $C_F$ is coupled between $V_{IN}$ and $V_{OUT}$. $C_{REF}$ and $C_{IN}$ from FIG. 2A have been divided into 3 unit capacitors $C_{U1}, C_{U2}$ and $C_{U3}$. Capacitor $C_{U1}$ is coupled between reference node $-V_{REF}$ and $V_{INPUT}$ and $V_{IN}$ through switches S11–S13, and is coupled to bias node $V_{BIAS}$ through switches S20 and S21. Capacitor $C_{U2}$ is coupled between reference node $-V_{REF}$ and $V_{INPUT}$ and $V_{IN}$ through switches S14–S16, and is coupled to bias node $V_{BIAS}$ through switches S22 and S23. Capacitor $C_{U3}$ is coupled between reference node $-V_{REF}$ and $V_{INPUT}$ and $V_{IN}$ through switches S17–S19, and is coupled to bias node $V_{BIAS}$ through switches S24 and S25.

Figure 5:
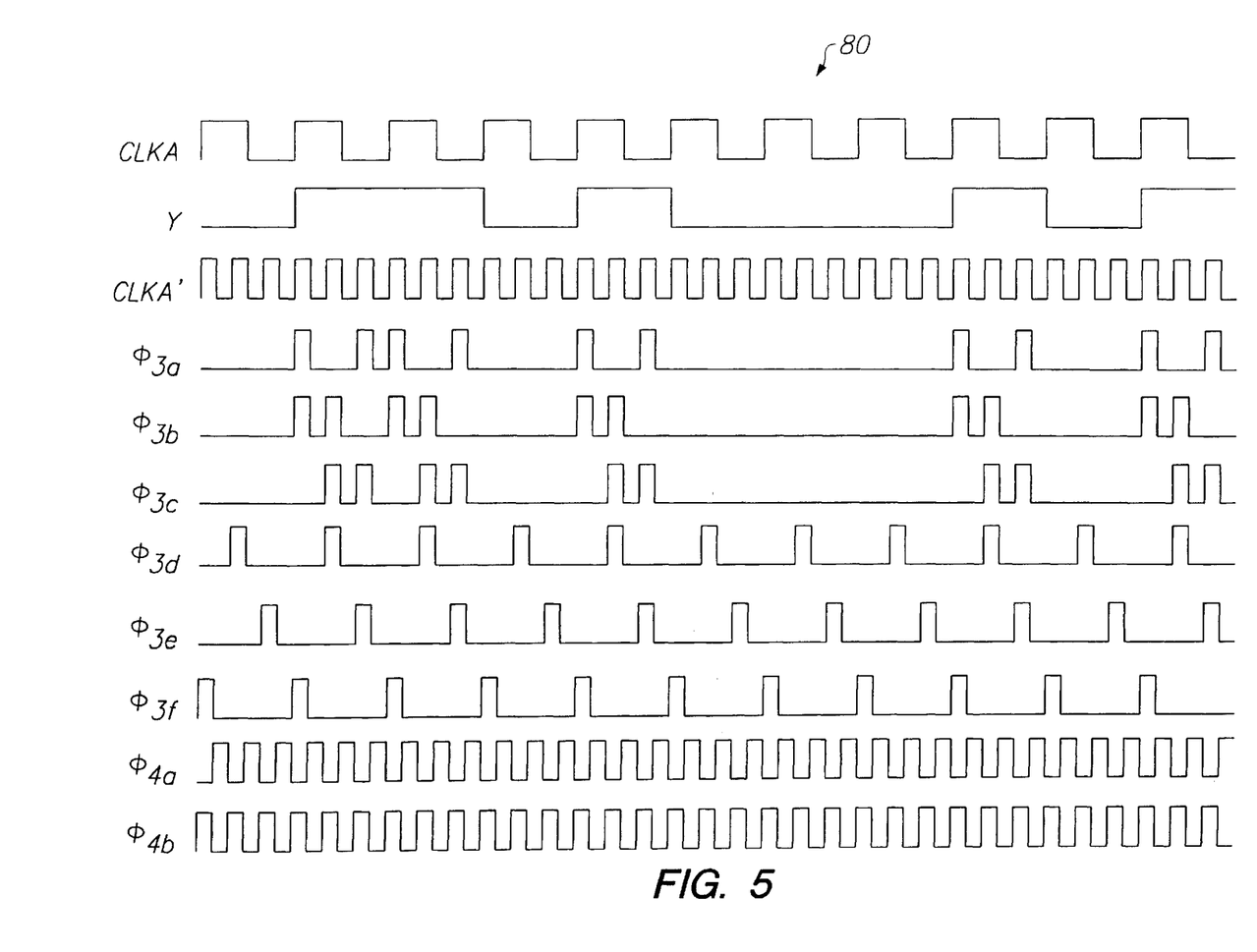
FIG. 5 is a timing diagram for the circuit of FIG. 4.

Switches S11, S13, S14, S16, S17 and S19 are controlled by clock signals $\phi_{3a}, \phi_{3d}, \phi_{3c},$ and $\phi_{3f},$ respectively. Switches S12, S15, S18, S20, S22 and S24 are controlled by clock signal $\phi_{4a}$, and switches S21, S23 and S25 are controlled by clock signal $\phi_{5a}$. State machine 74 receives as inputs CLKA' and Y, and generates clock signals $\phi_{3a}, \phi_{3b}, \phi_{3c}, \phi_{3d}, \phi_{3e}, \phi_{3f}, \phi_{4a}$ and $\phi_{5a}$ in accordance with techniques that are well-known. FIG. 5 shows the timing relationship between CLKA, Y, CLKA', $\phi_{3a}, \phi_{3b}, \phi_{3c}, \phi_{3d}, \phi_{3e}, \phi_{3f}, \phi_{4a}$ and $\phi_{5a}$. Y only may change on the rising edge of CLKA.

Circuit 70 receives signals $V_{INPUT}$ and $-V_{REF}$ and produces the intermediary signal IE1 (FIG. 1) at $V_{OUT}$. Bias signal $V_{BIAS}$ is used as a reference for charging and discharging charge transfer capacitors $C_{U1}, C_{U2}$ and $C_{U3}$ and integrating capacitor $C_F$. The implementation of amplifier 72 that facilitates the charge transfer from the sampling capacitors $C_{U1}, C_{U2}$ and $C_{U3}$ to integrating capacitor $C_F$ is well-known.

The frequency of clock signal CLKA' is three times (i.e, C(M+N,N)) the frequency of CLKA. Accordingly, three cycles of CLKA' occur during a single cycle of CLKA. If Y is HIGH during a cycle of CLKA, subtractor/integrator 70 operates as follows. During the first cycle of CLKA', when clock signals $\phi_{3a}, \phi_{3b}, \phi_{3f}$ and $\phi_{5a}$ are all HIGH, an electrical charge $Q_1$ proportional to reference signal $-V_{REF}(Q_1 = -C_{U1}*V_{REF})$ is stored on capacitor $C_{U1}$, an electrical charge $Q_2$ proportional to reference signal $-V_{REF}(Q_2 = -C_{U2}*V_{REF})$ is stored on capacitor $C_{U2}$, and an electrical charge $Q_3$ proportional to input signal $V_{INPUT}(Q_3 = C_{U3}*V_{INPUT})$ is stored on capacitor $C_{U3}$. On the next pulse of $\phi_{4a}$ (i.e., when $\phi_{5a}$ goes LOW and $\phi_{4a}$ goes HIGH), electrical charges $Q_1$, $Q_2$ and $Q_3$ are transferred to integrating capacitor $C_F$.

During the second cycle of CLKA', when clock signals $\phi_{3b}$, $\phi_{3c}$, $\phi_{3d}$ and $\phi_{5a}$ are all HIGH, an electrical charge $Q_1$ proportional to input signal $V_{INPUT}(Q_1=C_{U1}*V_{INPUT})$ is stored on capacitor $C_{U1}$, an electrical charge $Q_2$ proportional to reference signal $-V_{REF}$ $(Q_2=-C_{U2}*V_{REF})$ is stored on capacitor $C_{U2}$, and an electrical charge $Q_3$ proportional to reference signal $-V_{REF}(Q_3=-C_{U3}*V_{REF})$ is stored on capacitor $C_{U3}$. On the next pulse of $\phi_{4a}$ (i.e., when $\phi_{5a}$ goes LOW and $\phi_{4a}$ goes HIGH), electrical charges $Q_1$, $Q_2$ and $Q_3$ are transferred to integrating capacitor $C_F$.

During the third cycle of CLKA', when clock signals $\phi_{3a}$, $\phi_{3c}$, $\phi_{3e}$ and $\phi_{5a}$ are all HIGH, an electrical charge $Q_1$ proportional to reference signal $-V_{REF}$ $(Q_1=-C_{U1}*V_{REF})$ is stored on capacitor $C_{U1}$, an electrical charge $Q_2$ proportional to input signal $V_{INPUT}$ $(Q_2=C_{U2}*V_{INPUT})$ is stored on capacitor $C_{U2}$, and an electrical charge $Q_3$ proportional to reference signal $-V_{REF}(Q_3=-C_{U3}*V_{REF})$ is stored on capacitor $C_{U3}$. On the next pulse of $\phi_{4a}$ (i.e., when $\phi_{5a}$ goes LOW and $\phi_{4a}$ goes HIGH), electrical charges $Q_1$, $Q_2$ and $Q_3$ are transferred to integrating capacitor $C_F$.

Thus, when Y is HIGH during a complete cycle of CLKA, the total charge $Q_{TOT}$(HIGH) transferred to integrating capacitor $C_F$ equals the sum of the charges stored on $C_{U1}$, $C_{U2}$ and $C_{U3}$ during the cycle:

$$Q_{TOT}(\text{HIGH})=(C_{U1}+C_{U2}+C_{U3})*V_{INPUT}-2(C_{U1}+C_{U2}+C_{U3})*V_{REF} \quad (7)$$

If $C_{U1}+C_{U2}+C_{U3}=C_X$, equation (7) may be re-written as:

$$Q_{TOT}(\text{HIGH})=C_X*V_{INPUT}-2*C_X*V_{REF} \quad (8)$$

Equation (8) is identical to equation (4), where $C_X=C_{IN}$ and $C_{REF}=2*C_{IN}$.

If Y is LOW during a cycle of CLKA, subtractor/integrator 70 operates as follows. During the first cycle of CLKA', when clock signals $\phi_{3f}$ and $\phi_{5a}$ are both HIGH, an electrical charge $Q_3$ proportional to input signal $V_{INPUT}(Q_3=C_{U3}*V_{INPUT})$ is stored on capacitor $C_{U3}$. On the next pulse of $\phi_{4a}$ (i.e., when $\phi_{5a}$ goes LOW and $\phi_{4a}$ goes HIGH), electrical charge $Q_3$ transfers to integrating capacitor $C_F$.

During the second cycle of CLKA', when clock signals $\phi_{3d}$ and $\phi_{5a}$ are both HIGH, an electrical charge $Q_1$ proportional to input signal $V_{INPUT}(Q_1=C_{U1}*V_{INPUT})$ is stored on capacitor $C_{U1}$. On the next pulse of $\phi_{4a}$ (i.e., when $\phi_{5a}$ goes LOW and $\phi_{4a}$ goes HIGH), electrical charge $Q_1$ transfers to integrating capacitor $C_F$.

During the third cycle of CLKA', when clock signals $\phi_{3e}$ and $\phi_{5a}$ are both HIGH, an electrical charge $Q_2$ proportional to input signal $V_{INPUT}(Q_2=C_{U2}*V_{INPUT})$ is stored on capacitor $C_{U2}$. On the next pulse of $\phi_{4a}$ (i.e., when $\phi_{5a}$ goes LOW and $\phi_{4a}$ goes HIGH), electrical charge $Q_2$ transfers to integrating capacitor $C_F$.

Thus, when Y is LOW during a complete cycle of CLKA, the total charge $Q_{TOT}$(LOW) transferred to integrating capacitor $C_F$ equals the sum of the charges stored on $C_{U1}$, $C_{U2}$ and $C_{U3}$ during the cycle:

$$Q_{TOT}(\text{LOW})=(C_{U1}+C_{U2}+C_{U3})*V_{INPUT} \quad (9)$$

If $C_{U1}+C_{U2}+C_{U3}C_X$, equation (9) may be re-written as:

$$Q_{TOT}(\text{LOW})=C_X*V_{INPUT} \quad (10)$$

Equation (10) is identical to equation (5), where $C_X=C_{IN}$.

Thus, at the end of a complete cycle of CLKA, each unit capacitor $C_{U1}$, $C_{U2}$ and $C_{U3}$ has been used once (i.e., a first predetermined number of times C(M+N−1, N−1)) to construct the equivalent input capacitor $C_{IN}$ and twice (when Y is HIGH) (i.e., a second predetermined number of times C(M+N−1, M−1)) to construct the equivalent reference capacitor $C_{REF}$. Hence, the ratio between the equivalent capacitance of $C_{IN}$ and $C_{REF}$ is 1:2, independent of the actual value of unit capacitors $C_{U1}$, $C_{U2}$ and $C_{U3}$.

Figure 6:
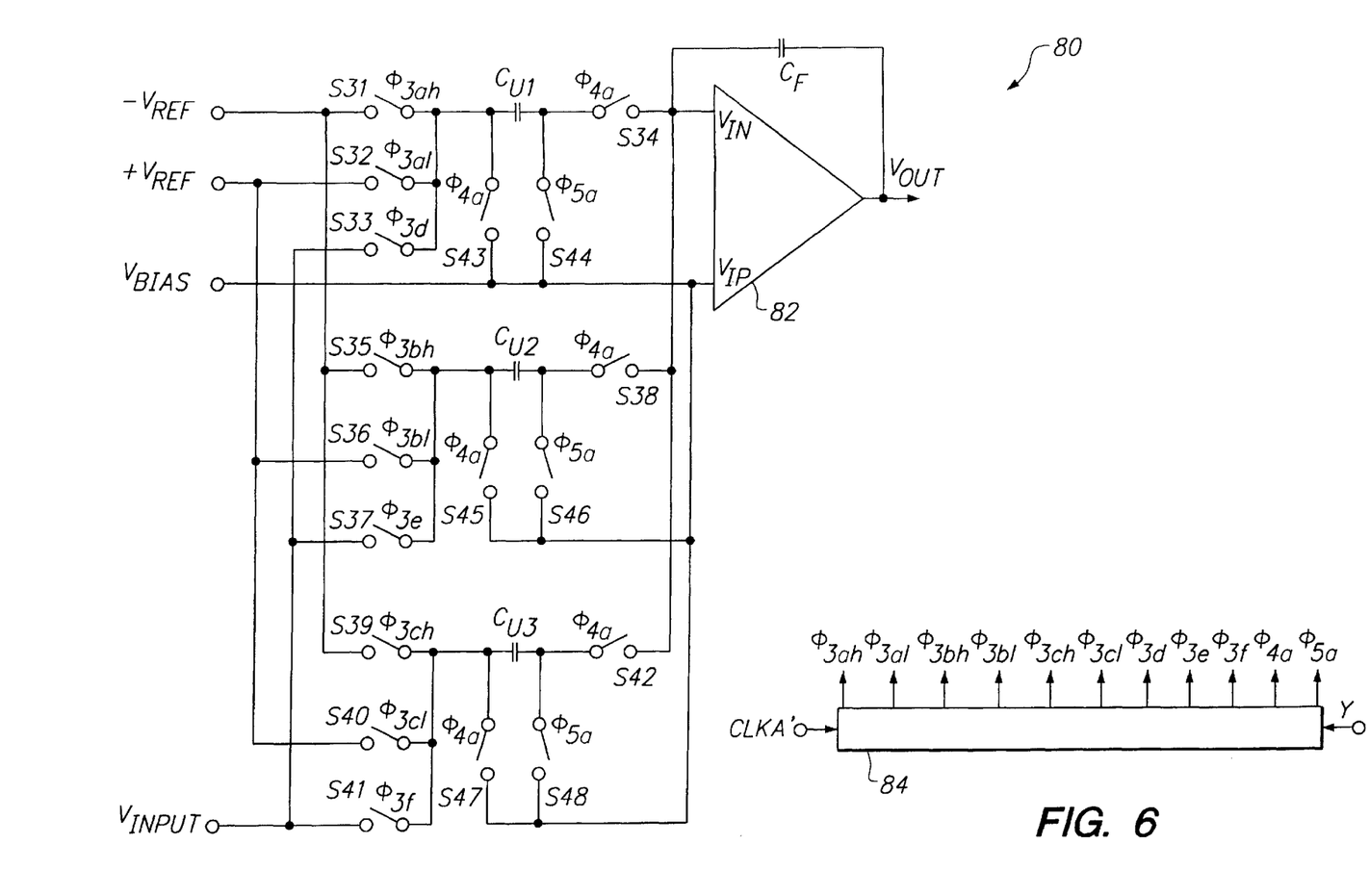
FIG. 6 is a schematic diagram of an illustrative embodiment of an alternative embodiment of a subtractor/integrator block and state machine of the present invention.

Referring now to FIG. 6, an alternative embodiment of a subtractor/integrator of the present invention is described in which N=1 and M=2, and the input signal $V_{INPUT}$ may have both positive and negative polarities. Subtractor circuit 80 includes amplifier 82 having inverting input $V_{IN}$, non-inverting input $V_{IP}$ and output $V_{OUT}$. Integrating capacitor $C_F$ is coupled between $V_{IN}$ and $V_{OUT}$. $C_{REF}$ and $C_{IN}$ from FIG. 2A have been divided into 3 unit capacitors $C_{U1}$, $C_{U2}$ and $C_{U3}$. Capacitor $C_{U1}$ is coupled between reference nodes $+V_{REF}$, $-V_{REF}$ and $V_{INPUT}$ and $V_{IN}$ through switches S31–S34, and is coupled to bias node $V_{BIAS}$ through switches S43 and S44. Capacitor $C_{U2}$ is coupled between reference node $+V_{REF}$, $-V_{REF}$ and $V_{INPUT}$ and $V_{IN}$ through switches S35–S38, and is coupled to bias node $V_{BIAS}$ through switches S45 and S46. Capacitor $C_{U3}$ is coupled between reference nodes $+V_{REF}$, $-V_{REF}$ and $V_{INPUT}$ and $V_{IN}$ through switches S39–S42, and is coupled to bias node $V_{BIAS}$ through switches S47 and S48.

Figure 7:
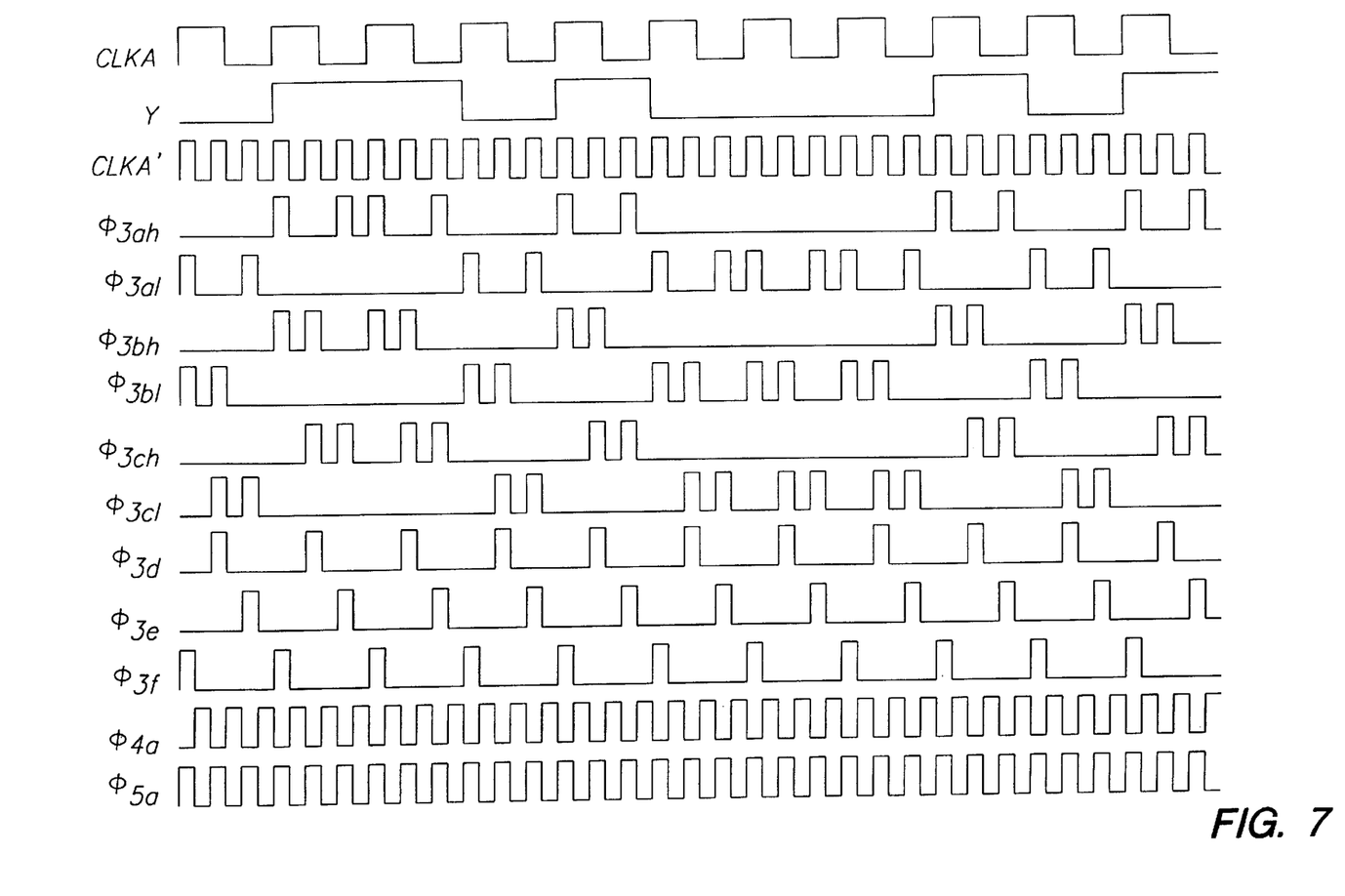
FIG. 7 is a timing diagram for the circuit of FIG. 6.

Switches S31, S32, S33, S35, S36, S37, S39, S40 and S41 are controlled by clock signals $\phi_{3ah}$, $\phi_{3al}$, $\phi_{3d}$, $\phi_{3bh}$, $\phi_{3bl}$, $\phi_{3e}$, $\phi_{3ch}$, $\phi_{3cl}$ and $\phi_{3f}$, respectively. Switches S34, S38, S42, S43, S45 and S47 are controlled by clock signal $\phi_{4a}$, and switches S44, S46 and S48 are controlled by clock signal $\phi_{5a}$. State machine 84 receives as input CLKA' and Y, and generates clock signals $\phi_{3ah}$, $\phi_{3al}$, $\phi_{3bh}$, $\phi_{3bl}$, $\phi_{ch}$, $\phi_{cl}$, $\phi_{3d}$, $\phi_{3e}$, $\phi_{3f}$, $\phi_{4a}$ and $\phi_{5a}$ in accordance with techniques that are well-known. FIG. 7 shows the timing relationship between CLKA, $\phi_{3ah}$, $\phi_{3al}$, $\phi_{3bh}$, $\phi_{3bl}$, $\phi_{ch}$, $\phi_{cl}$, $\phi_{3d}$, $\phi_{3e}$, $\phi_{3f}$, $\phi_{4a}$ and $\phi_{5a}$. Clock signals CLKA', $\phi_{3d}$, $\phi_{3e}$, $\phi_{3f}$, $\phi_{4a}$ and $\phi_{5a}$ are the same as shown in FIG. 5, and Y only may change on the rising edge of CLKA.

Circuit 80 receives signals $V_{INPUT}$ and $+V_{REF}$ and $-V_{REF}$ and produces intermediary signal IE1 (FIG. 1) at $V_{OUT}$. Bias signal $V_{BIAS}$ is used as reference for charging and discharging charge transfer capacitors $C_{U1}$, $C_{U2}$ and $C_{U3}$ and integrating capacitor $C_F$. The implementation of the amplifier 82 that facilitates the charge transfer from the sampling capacitors $C_{U1}$, $C_{U2}$ and $C_{U3}$ to integrating capacitor $C_F$ is well-known.

If Y is HIGH during a cycle of CLKA, subtractor/integrator 80 operates as follows. During the first cycle of CLKA', when clock signals $\phi_{3ah}$, $\phi_{3bh}$, $\phi_{3f}$ and $\phi_{5a}$ are all HIGH, an electrical charge $Q_1$ proportional to reference signal $-V_{REF}(Q_1=-C_{U1}*V_{REF})$ is stored on capacitor $C_{U1}$, an electrical charge $Q_2$ proportional to reference signal $-V_{REF}(Q_2=-C_{U2}*V_{REF})$ is stored on capacitor $C_{U2}$, and an electrical charge $Q_3$ proportional to input signal $V_{INPUT}(Q_3=C_{U3}*V_{INPUT})$ is stored on capacitor $C_{U3}$. On the next pulse of $\phi_{4a}$ (i.e., when $\phi_{5a}$ goes LOW and $\phi_{4a}$ goes HIGH), electrical charges $Q_1$, $Q_2$ and $Q_3$ are transferred to integrating capacitor $C_F$.

During the second cycle of CLKA', when clock signals $\phi_{3bh}$, $\phi_{3ch}$, $\phi_{3d}$ and $\phi_{5a}$ are all HIGH, an electrical charge $Q_1$ proportional to input signal $V_{INPUT}$ $(Q_1=C_{U1}*V_{INPUT})$ is stored on capacitor $C_{U1}$, an electrical charge $Q_2$ proportional to reference signal $-V_{REF}(Q_2=-C_{U2}*V_{REF})$ is stored on capacitor $C_{U2}$, and an electrical charge $Q_3$ proportional to reference signal $-V_{REF}(Q_3=-C_{U3}*V_{REF})$ is stored on capacitor $C_{U3}$. On the next pulse of $\phi_{4a}$ (i.e., when $\phi_{5a}$ goes LOW and $\phi_{4a}$ goes HIGH), electrical charges $Q_1$, $Q_2$ and $Q_3$ are transferred to integrating capacitor $C_F$.

During the third cycle of CLKA', when clock signals $\phi_{3ah}$, $\phi_{3ch}$, $\phi_{3e}$ and $\phi_{5a}$ are all HIGH, an electrical charge $Q_1$ proportional to reference signal $-V_{REF}$ ($Q_1=-C_{U1}*V_{REF}$) is stored on capacitor $C_{U1}$, an electrical charge $Q_2$ proportional to input signal $V_{INPUT}$ ($Q_2=C_{U2}*V_{INPUT}$) is stored on capacitor $C_{U2}$, and an electrical charge $Q_3$ proportional to reference signal $-V_{REF}$($Q_3=-C_{U3}*V_{REF}$) is stored on capacitor $C_{U3}$. On the next pulse of $\phi_{4a}$ (i.e., when $\phi_{5a}$ goes LOW and $\phi_{4a}$ goes HIGH), electrical charges $Q_1$, $Q_2$ and $Q_3$ are transferred to integrating capacitor $C_F$.

Thus, when Y is HIGH during a complete cycle of CLKA, the total charge $Q_{TOT}$(HIGH) transferred to integrating capacitor $C_F$ equals the sum of the charges stored on $C_{U1}$, $C_{U2}$ and $C_{U3}$ during the cycle:

$$Q_{TOT}(\text{HIGH})=(C_{U1}+C_{U2}+C_{U3})*V_{INPUT}-2(C_{U1}+C_{U2}+C_{U3})*V_{REF} \quad (11)$$

If Y is LOW during a cycle of CLKA, subtractor/integrator 80 operates as follows. During the first cycle of CLKA', when clock signals $\phi_{3al}$, $\phi_{3bl}$, $\phi_{3f}$ and $\phi_{5a}$ are all HIGH, an electrical charge $Q_1$ proportional to reference signal $+V_{REF}$($Q_1=+C_{U1}*V_{REF}$) is stored on capacitor $C_{U1}$, an electrical charge $Q_2$ proportional to reference signal $+V_{REF}$($Q_2=+C_{U2}*V_{REF}$) is stored on capacitor $C_{U2}$, and an electrical charge $Q_3$ proportional to input signal $V_{INPUT}$($Q_3=C_{U3}*V_{INPUT}$) is stored on capacitor $C_{U3}$. On the next pulse of $\phi_{4a}$ (i.e., when $\phi_{5a}$ goes LOW and $\phi_{4a}$ goes HIGH), electrical charges $Q_1$, $Q_2$ and $Q_3$ are transferred to integrating capacitor $C_F$.

During the second cycle of CLKA', when clock signals $\phi_{3bl}$, $\phi_{3cl}$, $\phi_{3d}$ and $\phi_{5a}$ are all HIGH, an electrical charge $Q_1$ proportional to input signal $V_{INPUT}$ ($Q_1=C_{U1}*V_{INPUT}$) is stored on capacitor $C_{U1}$, an electrical charge $Q_2$ proportional to reference signal $+V_{REF}$($Q_2=+C_{U2}*V_{REF}$) is stored on capacitor $C_{U2}$, and an electrical charge $Q_3$ proportional to reference signal $+V_{REF}$($Q_3=+C_{U3}*V_{REF}$) is stored on capacitor $C_{U3}$. On the next pulse of $\phi_{4a}$ (i.e., when $\phi_{5a}$ goes LOW and $\phi_{4a}$ goes HIGH), electrical charges $Q_1$, $Q_2$ and $Q_3$ are transferred to integrating capacitor $C_F$.

During the third cycle of CLKA', when clock signals $\phi_{3al}$, $\phi_{3c}$, $\phi_{3e}$ and $\phi_{5a}$ are all HIGH, an electrical charge $Q_1$ proportional to reference signal $+V_{REF}$($Q_1=+C_{U1}*V_{REF}$) is stored on capacitor $C_{U1}$, an electrical charge $Q_2$ proportional to input signal $V_{INPUT}$ ($Q_2=C_{U2}*V_{INPUT}$) is stored on capacitor $C_{U2}$, and an electrical charge $Q_3$ proportional to reference signal $+V_{REF}$($Q_3=+C_{U3}*V_{REF}$) is stored on capacitor $C_{U3}$. On the next pulse of $\phi_{4a}$ (i.e., when $\phi_{5a}$ goes LOW and $\phi_{4a}$ goes HIGH), electrical charges $Q_1$, $Q_2$ and $Q_3$ are transferred to integrating capacitor $C_F$.

Thus, when Y is LOW during a complete cycle of CLKA, the total charge $Q_{TOT}$(LOW) transferred to integrating capacitor $C_F$ equals the sum of the charges stored on $C_{U1}$, $C_{U2}$ and $C_{U3}$ during the cycle:

$$Q_{TOT}(\text{LOW})=(C_{U1}+C_{U2}+C_{U3})*V_{INPUT}+2(C_1+C_{U2}+C_{U3})*V_{REF} \quad (12)$$

If $C_{U1}+C_{U2}+C_{U3}=C_X$, equations (11) and (12) may be re-written, respectively, as:

$$Q_{TOT}(\text{HIGH})=C_X*V_{INPUT}-2*C_X V_{REF} \quad (13)$$

$$Q_{TOT}(\text{LOW})=C_X*V_{INPUT}-2*C_X V_{REF} \quad (14)$$

Thus, at the end of a complete cycle of CLKA, when Y is HIGH or LOW, each unit capacitor $C_{U1}$, $C_{U2}$ and $C_{U3}$ has been used once (i.e., a first predetermined number of times C(M+N−1, N−1)) to construct the equivalent input capacitor $C_{IN}$ and twice (i.e., a first predetermined number of times C(M+N−1, M−1)) to construct the equivalent reference capacitor $C_{REF}$. Hence, the ratio between the equivalent capacitance of $C_{IN}$ and $C_{REF}$ is 1:2, independent of the actual value of unit capacitors $C_{U1}$, $C_{U2}$ and $C_{U3}$.

Persons skilled in the art further will recognize that the circuitry of the present invention may be implemented using circuit configurations other than those shown and discussed above. For example, the circuits of FIGS. 4 and 6 may be implemented as fully-differential circuits. All such modifications are within the scope of the present invention, which is limited only by the claims that follow.

What is claimed is:

1. A subtractor/integrator circuit that generates at an output node an output signal proportional to the sum of (a) an input signal multiplied by a predetermined scale factor N/M and (b) a reference signal, the subtractor/integrator circuit comprising:

an input signal node to which the input signal is applied;

a reference signal node to which the reference signal is applied;

a bias signal node to which a bias signal is applied;

an output circuit coupled to the bias signal node, the output circuit having an output coupled to the output node;

N+M switched-capacitor circuits coupled to the input signal node, the reference signal node, the bias signal node and the output circuit; and control circuitry coupled to the N+M switched capacitor circuits, the control circuitry causing each of the N+M switched capacitor circuits to sample the input signal a first predetermined number of times and to sample the reference signal a second predetermined number of times, wherein the ratio of the first predetermined number to the second predetermined number equals the scale factor N/M.

2. The apparatus of claim 1, wherein the N+M switched capacitor circuits each comprise a capacitor.

3. The apparatus of claim 2, wherein each capacitor comprises a top plate and a bottom plate.

4. The apparatus of claim 1, wherein:

the output circuit comprises an amplifier having an inverting input node coupled to the N+M switched-capacitor circuits, a non-inverting input node coupled to the bias signal node, and an output signal node coupled to the output node; and the subtractor/integrator circuit further comprises a feedback capacitor coupled between the inverting input node and the output node.

5. The apparatus of claim 4, wherein the N+M switched capacitor circuits each further comprise first and second inputs, and first and second outputs, the first input coupled to the reference signal node, the second input coupled to the input signal node, the first output coupled to the inverting input node and the second output coupled to the non-inverting input node.

6. The apparatus of claim 5, wherein the N+M switched capacitor circuits each further comprise:

a first switch coupled between the reference signal node and the top plate of the capacitor;

a second switch coupled between the bottom plate of the capacitor and the inverting input node;

a third switch coupled between the input signal node and the top plate of the capacitor;

a fourth switch coupled between the top plate of the capacitor and the non-inverting input node; and a fifth switch coupled between the bottom plate of the capacitor and the non-inverting input.

7. The apparatus of claim 3, wherein:

the control circuitry provides at a plurality of outputs a plurality of control signals;

the N+M switched capacitor circuits each further comprise first, second, third and fourth control inputs coupled to the plurality of control signals; and the plurality of control signals cause each of the N+M switched capacitor circuits to sample the input signal the first predetermined number of times and to sample the reference signal the second predetermined number of times.

8. The apparatus of claim 7, wherein the N+M switched capacitor circuits each further comprise:

a first switch coupled between the reference signal node and the top plate of the capacitor, the first switch comprising a switch control input coupled to the first control input;

a second switch coupled between the bottom plate of the capacitor and the inverting input node, the second switch comprising a switch control input coupled to the second control input;

a third switch coupled between the top plate of the capacitor and the input signal node, the third switch comprising a switch control input coupled to the third control input;

a fourth switch coupled between the top plate of the capacitor and the non-inverting input node, the fourth switch comprising a switch control input coupled to the second control input; and a fifth switch coupled between the bottom plate of the capacitor and the non-inverting input, the fifth switch comprising a switch control input coupled to the fourth control input.

9. The apparatus of claim 8, wherein:

N=1 and M=2, and the N+M=3 switched capacitor circuits comprise first, second and third switched capacitor circuits; and the second control input of each of the first, second and third switched capacitor circuits are coupled together, and the fourth control input of each of the first, second and third switched capacitor circuits are coupled together.

10. A subtractor/integrator circuit that generates at an output node an output signal proportional to the sum of (a) an input signal multiplied by a predetermined scale factor N/M and (b) either of a first or second reference signals, the subtractor/integrator circuit comprising:

an input signal node to which the input signal is applied;

a first reference signal node to which the first reference signal is applied, and a second reference signal node to which the second reference signal is applied;

a bias signal node to which a bias signal is applied;

an output circuit coupled to the bias signal node, the output circuit having an output coupled to the output node;

N+M switched-capacitor circuits coupled to the input signal node, the first reference signal node, the second reference signal node, the bias signal node and the output circuit; and control circuitry coupled to the N+M switched capacitor circuits, the control circuitry causing each of the N+M switched capacitor circuits to sample the input signal a first predetermined number of times and to sample either the first or second reference signals a second predetermined number of times, wherein the ratio of the first predetermined number to the second predetermined number equals the scale factor N/M.

11. The apparatus of claim 10, wherein the N+M switched capacitor circuits each comprise a capacitor.

12. The apparatus of claim 11, wherein each capacitor comprises a top plate and a bottom plate.

13. The apparatus of claim 10, wherein:

the output circuit comprises an amplifier having an inverting input node coupled to the N+M switched-capacitor circuits, a non-inverting input node coupled to the bias signal node, and an output signal node coupled to the output node; and the subtractor/integrator circuit further comprises a feedback capacitor coupled between the inverting input node and the output node.

14. The apparatus of claim 13, wherein the N+M switched capacitor circuits each further comprise first, second and third inputs, and first and second outputs, the first input coupled to the first reference signal node, the second input coupled to the second reference signal node, and the third input coupled to the input signal node, the first output coupled to the inverting input node and the second output coupled to the non-inverting input node.

15. The apparatus of claim 14, wherein the N+M switched capacitor circuits each further comprise:

a first switch coupled between the first reference signal node and the top plate of the capacitor;

a second switch coupled between the bottom plate of the capacitor and the inverting input node;

a third switch coupled between the second reference signal node and the top plate of the capacitor;

a fourth switch coupled between the top plate of the capacitor and the non-inverting input node;

a fifth switch coupled between the bottom plate of the capacitor and the non-inverting input; and a sixth switch coupled between the input signal node and the top plate of the capacitor.

16. The apparatus of claim 12, wherein:

the control circuitry provides at a plurality of outputs a plurality of control signals;

the N+M switched capacitor circuits each further comprise first, second, third, fourth and fifth control inputs coupled to the plurality of control signals; and the plurality of control signals cause each of the N+M switched capacitor circuits to sample the input signal the first predetermined number of times and to sample either the first reference signal or the second reference signal the second predetermined number of times.

17. The apparatus of claim 16, wherein the N+M switched capacitor circuits each further comprise:

a first switch coupled between the first reference signal node and the top plate of the capacitor, the first switch comprising a switch control input coupled to the first control input;

a second switch coupled between the bottom plate of the capacitor and the inverting input node, the second switch comprising a switch control input coupled to the second control input;

a third switch coupled between the second reference signal node and the top plate of the capacitor, the third switch comprising a switch control input coupled to the third control input;

a fourth switch coupled between the top plate of the capacitor and the non-inverting input node, the fourth switch comprising a switch control input coupled to the second control input;

a fifth switch coupled between the bottom plate of the capacitor and the non-inverting input, the fifth switch comprising a switch control input coupled to the fourth control input; and a sixth switch coupled between the input signal node and the top plate of the capacitor, the sixth switch comprising a switch control input coupled to the fifth control input.

18. The apparatus of claim 17, wherein:

N=1 and M=2, and the N+M=3 switched capacitor circuits comprise first, second and third switched capacitor circuits; and the second control input of each of the first, second and third switched capacitor circuits are coupled together, and the fourth control input of each of the first, second and third switched capacitor circuits are coupled together.

19. A method for generating an output signal proportional to the sum of (a) an input signal multiplied by a predetermined scale factor N/M and (b) a reference signal, the method comprising:

storing a first charge proportional to the input signal on each of N+M capacitors a first predetermined number of times;

storing a second charge proportional to the reference signal on each of N+M capacitors a second predetermined number of times, wherein the ratio of the first predetermined number to the second predetermined number equals the scale factor N/M; and transferring the first charge and the second charge to an integrating capacitor, wherein the voltage across the integrating capacitor comprises the output signal.

20. A method for generating an output signal proportional to the sum of (a) an input signal multiplied by a predetermined scale factor N/M and (b) either a first or a second reference signal, the method comprising:

storing a first charge proportional to the input signal on each of N+M capacitors a first predetermined number of times;

storing a second charge proportional to either the first or the second reference signal on each of the N+M capacitors a second predetermined number of times, wherein the ratio of the first predetermined number to the second predetermined number equals the scale factor N/M; and transferring the first charge and the second charge to an integrating capacitor, wherein the voltage across the integrating capacitor comprises the output signal.

* * * * *

UNITED STATES PATENT AND TRADEMARK OFFICE
CERTIFICATE OF CORRECTION

PATENT NO. : 6,140,950
DATED : Oct. 31, 2000
INVENTOR(S) : Florin Oprescu

It is certified that error appears in the above-identified patent and that said Letters Patent is hereby corrected as shown below:

Column 1, line 58, change "integrators 14 and 18" to --integrators 14, 16, and 18--.

Column 2, line 57, change "$D_{DFSI}$" to --$D_{FSI}$--.

Column 4, line 51, change "- $V_{INPUT}$" to --$V_{INPUT}$--.

Column 6, line 6, change "C(M+N1, M-1))" to --C(M+N-1, M-1)--.

Column 6, lines 10 and 11, change "C" at the end of line 10 and "(M+N,N)" at the beginning of line 11 to --C(M+N, N)--.

Column 6, line 37, change "$\Phi_{3a}$, $\Phi_{3d}$, $\Phi_{3c}$ and $\Phi_{3f}$" to --$\Phi_{3a}$, $\Phi_{3d}$, $\Phi_{3b}$, $\Phi_{3e}$, $\Phi_{3c}$ and $\Phi_{3f}$--.

Column 7, line 61, change "$C_{u1}+C_{u2}+C_{u3}C_x$" to --$C_{u1}+C_{u2}+C_{u3}=C_x$--.

Column 9, line 63, change "$Q_{TOT}(LOW)=C_x*V_{INPUT}-2*C_xV_{REF}$" to --$Q_{TOT}(LOW)=C_x*V_{INPUT}+2*C_xV_{REF}$--.

Column 10, line 2, change "a first predetermined" to --a second predetermined--.

UNITED STATES PATENT AND TRADEMARK OFFICE
CERTIFICATE OF CORRECTION

PATENT NO. : 6,140,950
DATED : Oct. 31, 2000
INVENTOR(S) : Florin Oprescu It is certified that error appears in the above-identified patent and that said Letters Patent is hereby corrected as shown below:

In the drawings, Sheet 5, Fig. 5, the label at the bottom of the page, change "$\Phi_{4b}$" to --$\Phi_{5a}$--.

Signed and Sealed this

Twenty-ninth Day of May, 2001

Attest:

Attesting Officer

NICHOLAS P. GODICI

Acting Director of the United States Patent and Trademark Office